United States Patent
Chang

(10) Patent No.: US 7,132,809 B1
(45) Date of Patent: Nov. 7, 2006

(54) FAN-CONTROLLING SYSTEM TO CONTROL A PLURALITY OF FANS WITH DIFFERENT PULSE WIDTH MODULATION SIGNALS

(75) Inventor: Chao-Huang Chang, Taipei (TW)

(73) Assignee: Inventec Corporation (TW)

( * ) Notice: Subject to any disclaimer, the term of this patent is extended or adjusted under 35 U.S.C. 154(b) by 0 days.

(21) Appl. No.: 11/272,543

(22) Filed: Nov. 9, 2005

(51) Int. Cl.
- *H02P 5/46* (2006.01)
- *H01R 39/46* (2006.01)
- *H05K 7/20* (2006.01)

(52) U.S. Cl. ............... 318/268; 318/254; 318/811; 318/67; 318/34; 318/599; 361/695

(58) Field of Classification Search ............ None
See application file for complete search history.

(56) References Cited

U.S. PATENT DOCUMENTS

| | | | | |
|---|---|---|---|---|
| 5,528,114 A * | 6/1996 | Tokizaki et al. | ............... | 318/67 |
| 5,963,887 A * | 10/1999 | Giorgio | ............... | 702/64 |
| 6,368,064 B1 * | 4/2002 | Bendikas et al. | ............... | 318/599 |
| 6,512,346 B1 * | 1/2003 | Yoshimura | ............... | 318/599 |
| 6,545,438 B1 * | 4/2003 | Mays, II | ............... | 318/254 |
| 6,573,671 B1 * | 6/2003 | Montero et al. | ............... | 318/53 |
| 6,646,877 B1 * | 11/2003 | Willers et al. | ............... | 361/695 |
| 6,725,132 B1 * | 4/2004 | Frankel et al. | ............... | 700/300 |
| 6,801,004 B1 * | 10/2004 | Frankel et al. | ............... | 318/268 |
| 6,806,673 B1 * | 10/2004 | Ho | ............... | 318/599 |
| 6,876,164 B1 * | 4/2005 | Liu | ............... | 318/434 |
| 6,891,342 B1 * | 5/2005 | Nakamura et al. | ............... | 318/77 |
| 6,931,306 B1 * | 8/2005 | Frankel et al. | ............... | 700/300 |
| 6,932,696 B1 * | 8/2005 | Schwartz et al. | ............... | 454/184 |
| 6,933,687 B1 * | 8/2005 | Makaran et al. | ............... | 318/34 |
| 6,954,684 B1 * | 10/2005 | Frankel et al. | ............... | 700/300 |
| 6,995,532 B1 * | 2/2006 | Frankel et al. | ............... | 318/268 |

* cited by examiner

*Primary Examiner*—Lincoln Donovan
*Assistant Examiner*—Eduardo Colon Santana
(74) *Attorney, Agent, or Firm*—Peter F. Corless; Steven M. Jensen; Edwards Angell Palmer & Dodge LLP

(57) ABSTRACT

A fan controlling system applicable in an electronic system having a plurality of fans is disclosed. The fan-controlling system includes a first signal generating module and a second signal generating module for generating a first and a second pulse width modulation (PWM) signals according to control instructions output by the electronic system. The fan-controlling system further includes a phase-inverting module and a delay module. Therefore, PWM signals, which are delayed with a time interval one another, can be generated by the fan controlling system, so as to respectively control a plurality of fans of the electronic system, thereby avoiding the peak value of the total power signals when the fans are run from increasing instantly, and power signal for supplying the electronic system from decreasing instantly, making the electronic system run abnormally, and its stability becomes worse.

6 Claims, 7 Drawing Sheets

FAN-CONTROLLING SYSTEM TO CONTROL A PLURALITY OF FANS WITH DIFFERENT PULSE WIDTH MODULATION SIGNALS

BACKGROUND OF THE INVENTION

1. Field of the Invention

The present invention relates generally to a voltage stabilizing technology, and more particularly, to a fan-controlling system to control a plurality of fans with different pulse width modulation signals, so as to enable surge currents generated by the fans to occur at different time points when voltage levels of the PWM signals are changed, thereby preventing a voltage drooping effect from occurring.

2. Description of Related Art

With rapid development of the electronic industry, electronic products are developed to have multiple functions and high performance. In order to meet the package requirement for micromation of the electronic product, heat generated when an electronic component installed on a circuit board of an electronic product will be distinctly increased, the requirement for the fans in number is continually increased. For example, a 1U or 2U system comprises six to eight or even twelve fans. A conventional technology controls all of the fans with identical pulse width modulation (PWM) signals. As shown in FIG. 1, a signal generating module 10 generates a PWM signal, and the conventional technology controls fans 11, 12 with the PWM signal only.

In conjunction with FIGS. 2 and 3 for reference, when a PWM signal 100 generated by the signal generating module 10 is turned from low voltage level "0" into high voltage level "1", the fans 11, 12 generate power (voltage or current) signals 301, 302 respectively. Due to load imposed by the fans 11, 12, a peak value of a total power signal 300 imposed on the fans 11,12 is increased instantly (as shown in FIG. 2), thereby affecting the power signal 200 too supply an electronic system having the fans 11, 12 too low a peak power 200a due to the load imposed by the fans 11, 12. Such the low peak power 200a can not supply the electronic system with sufficient operational power supply (OPS), making the electronic system can not work normally, and stability of the electronic system is also affected.

Accordingly, there exists a strong need in the art for a fan controlling system to solve various drawbacks of the above-described conventional technology.

SUMMARY OF THE INVENTION

Accordingly, it is an objective of the present invention to solve the drawbacks of the prior art by providing a fan controlling system which is applied in an electronic system. The fan controlling system can prevent the OPS of the electronic system from being affected by surge currents generated by fans, so as to assure that the electronic system work normally.

It is another objective of the present invention to provide a fan controlling system which can make the fans to generate the surge currents at different time points when a voltage level of the PWM signal is changed, thereby avoiding the voltage droop from occurrence.

In order to attain the object mentioned above and the others, a fan controlling system is provided according to the present invention. The fan controlling system is applied in an electronic system having a plurality of fans (e.g., first fan, second fan, third fan, fourth fan). The system includes a signal generating module having a first signal generating module and a second signal generating module, both of which are used to generate pulse width modulation (PWM) signals and outputting the pulse width modulation signals to the fans of the electronic system according to control instructions output by the electronic system, so as to control the fans with the pulse width modulation signals. The fan controlling system further includes an phase-inverting module for inverting a phase of a second pulse width modulation signal outputted from the second signal generating module into a phase-inverted signal, and outputting the phase-inverted signal to a second fan of the electronic system, so as to control the second fan with the phase-inverted signal. The fan controlling system further includes at least a delay module for delaying a first pulse width modulation signal outputted from the first signal generating module and the phase-inverted signal generated by the phase-inverting module, into a first delay signal and a second delay signal respectively, and outputting the first delay signal and the second delay signal to a third fan and a fourth fan of the electronic system, so as to control the third fan and the fourth fan respectively with the first delay signal and the second delay signal.

The first signal generating module and the second signal generating module are pulse width modulation generators, which are used to generate the first PWM signal and the second PWM signal according to the control instructions output by the electronic system. The first PWM signal has a first duty cycle, and the second PWM signal has a second duty cycle equal to one subtracted by one.

The phase-inverting module is one selected from a group consisting of a phase inverter and a phase-inverting circuit.

The delay module is one selected from a group consisting of a delayer and a delay circuit.

The electronic system is one selected from a group consisting of a computer system and a server system.

As described above, the fan controlling system according to the present invention, the first PWM signal and the second PWM signal, duty sum of which is 1, are provided by the first signal generating module and the second signal generating module, so that operations of the first fan and the second fan are directly controlled by the first PWM signal and the second PWM signal that is phase-inverting, simultaneously operations of the third and fourth fans are controlled by the first PWM signal and the phase-inverting second PWM signal that are delayed with a time interval by the delay module. Therefore, the fan controlling system according to the present invention can control the PWM signals of multiple fans assembled in the electronic system to generate delay with a time interval one another, avoiding the peak value of the total power signals when PWM signals of the fans are run from low voltage level to high voltage level from increasing instantly, and power for supplying the electronic system from decreasing instantly, making the electronic system run abnormally, and its stability becomes worse.

In addition, in the present invention, when the electronic system is added with more fans, it is necessary to add delay module with different delay factors to the fan controlling system which can delay the first PWM signal and the phase-inverting second PWM signal for outputting, so as to control operation of the subsequent added fans, thereby significantly upgrading the design spring of the circuit.

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

Figure 1:
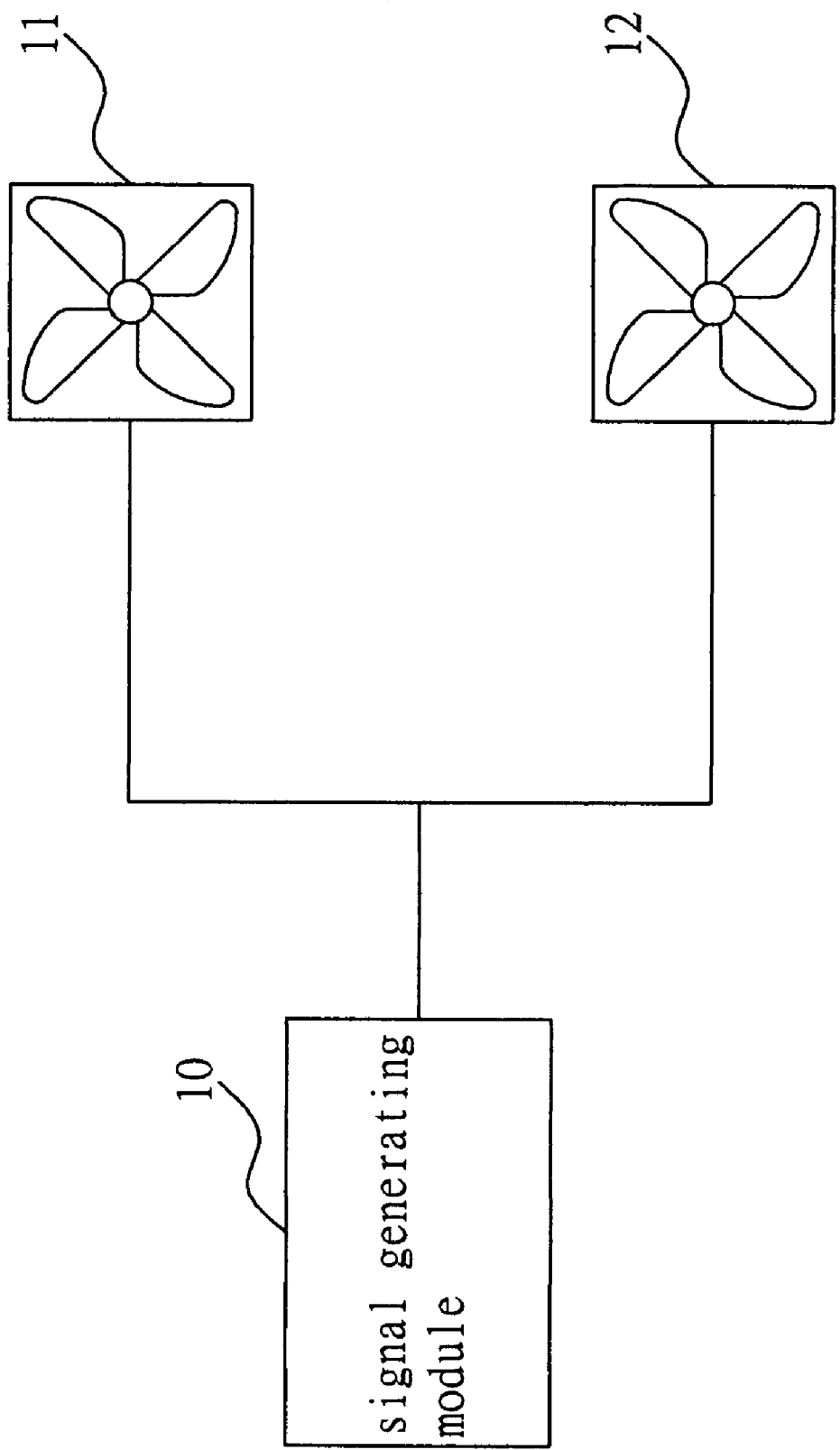
FIG. 1 depicts a structural schematic diagram of the conventional fan controlling system.
Figure 2:
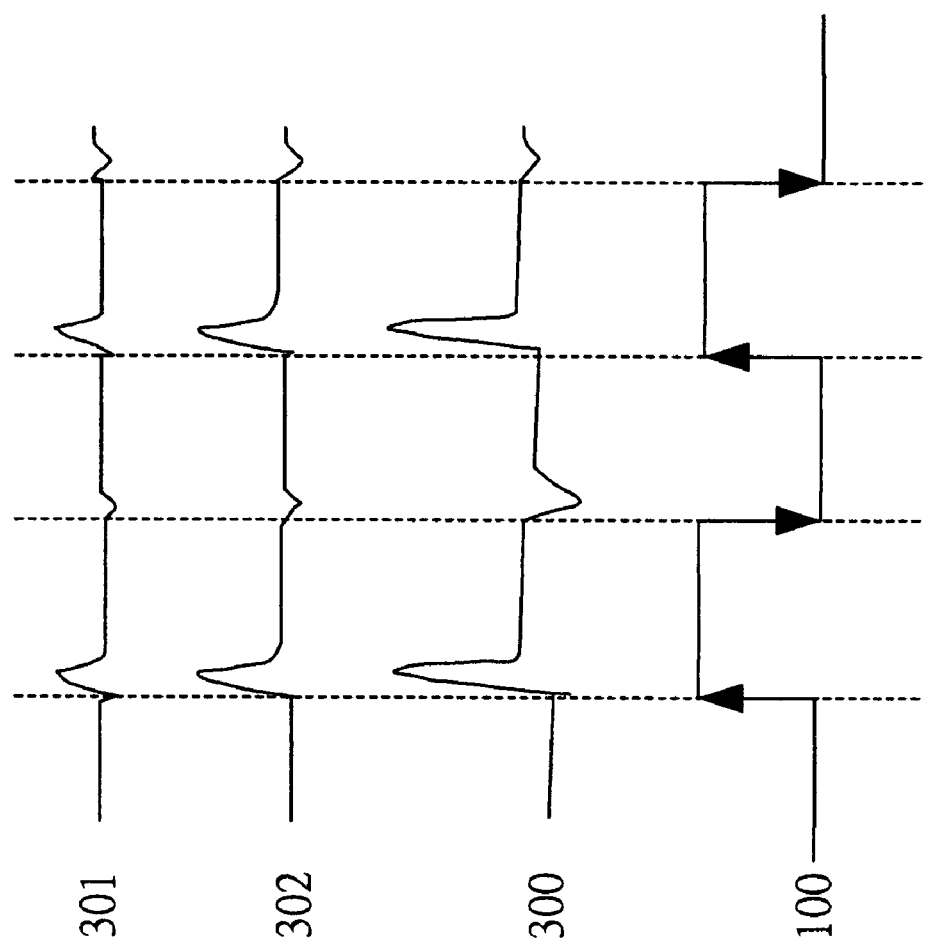
FIG. 2 depicts waveform schematic diagram of the signal generated by the signal generating module as shown in FIG. 1 on the fans and the waveform of the total power signal on the total fans.
Figure 3:
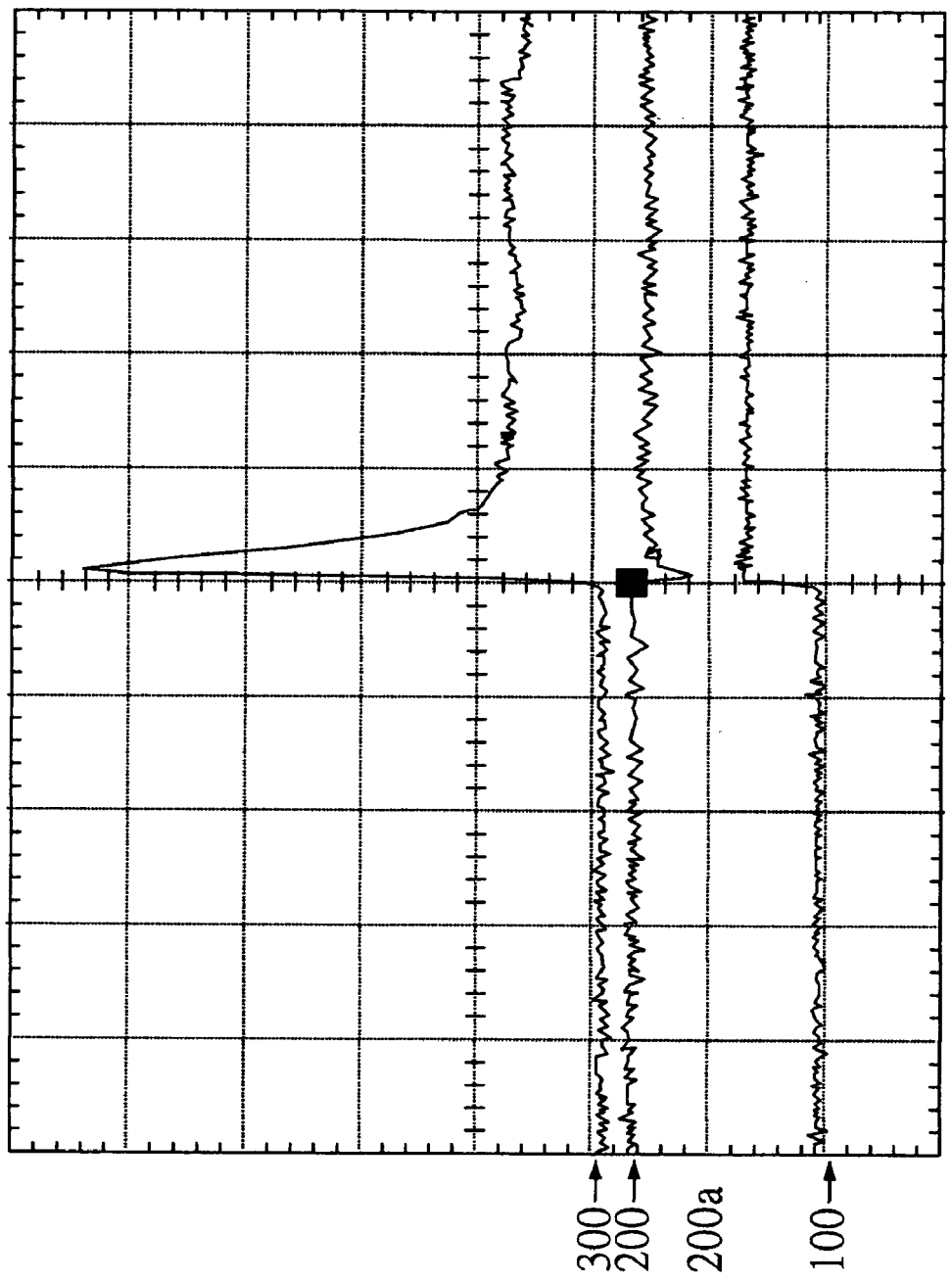
FIG. 3 depicts waveform schematic diagram of signals as shown in FIG. 2 and a power signal that is provided to the electronic system.
Figure 4:
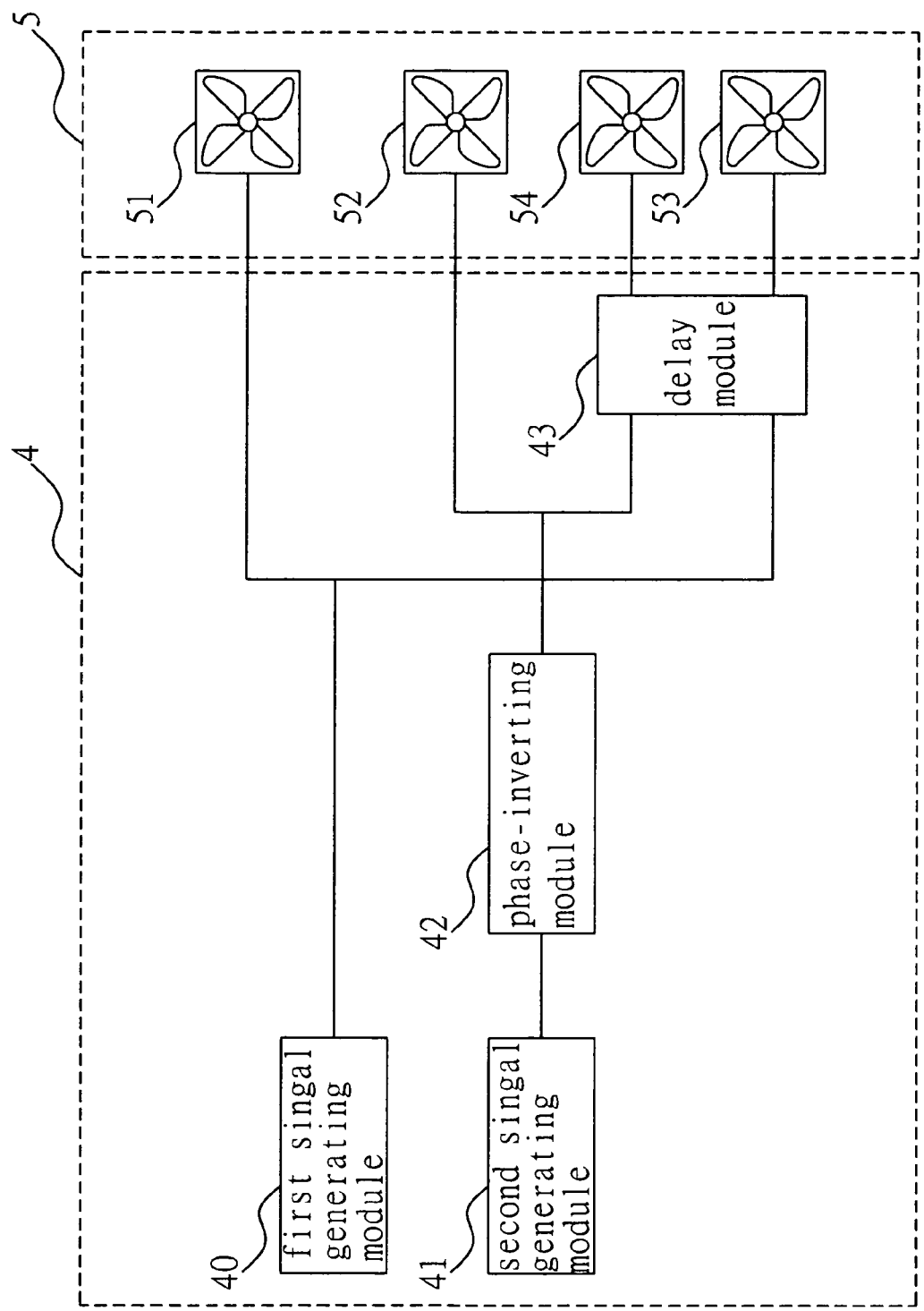
FIG. 4 depicts a schematic diagram of the basis structure according to the fan controlling system of the present invention.

Please refer to FIG. 4, which is a functional block diagram of a fan controlling system 1 according to the present invention. As shown in FIG. 4, the system 4 is applied in an electronic system 5 (e.g., computer system or server system) to control a plurality of the fans 51, 52, 53 and 54 (but it is not limited to this, more fans can be added to the electronic system 5 based on a user's demand) of the electronic system 5. The fans 51, 52, 53 and 54 are categorized into two groups—a first group consisting of the fans 51, 52, and a second group consisting of fans 53, 54. It should be noted that merely the structure pertaining to the present invention is illustrated, which is not to limit the scope of the present invention.

As shown in FIG. 4, the system 4 comprises a first signal generating module 40, a second signal generating module 41, a phase-inverting module 42 and a delay module 43. The first signal generating module 40, the second signal generating module 41, the phase-inverting module 42 and the delay module 43 will be described more fully below in conjunction with FIG. 5.

The first signal generating module 40 generates and outputs a first pulse width modulation (PWM) signal S1 to the fan 51, which is included in the first group, according to a first control instruction output by the electronic system 5, so as to control the fan 51 with the first PWM signal S1. More particularly, the first signal generating module 40 is a PWM generator, which can generate a first PWM power (voltage or current) signal having a first duty cycle equal to A according to the control instructions output by the electronic system 5 to control rotating speed of the fan 51. But the technology that employs PWM signal to control fan is conventional technology and widely used in industry, it will not be described again.

The second signal generating module 41 generates a second PWM signal S2 according to a second control instruction output by the electronic system 5. The second PWM signal has a second duty cycle B equal to one subtracted by the first duty cycle A. That is $$A+B=1 \qquad (1)$$

A fan rotates in close relation with a duty cycle. The larger the duty cycle is, the faster a rotating speed of the fan becomes.

Figure 5:
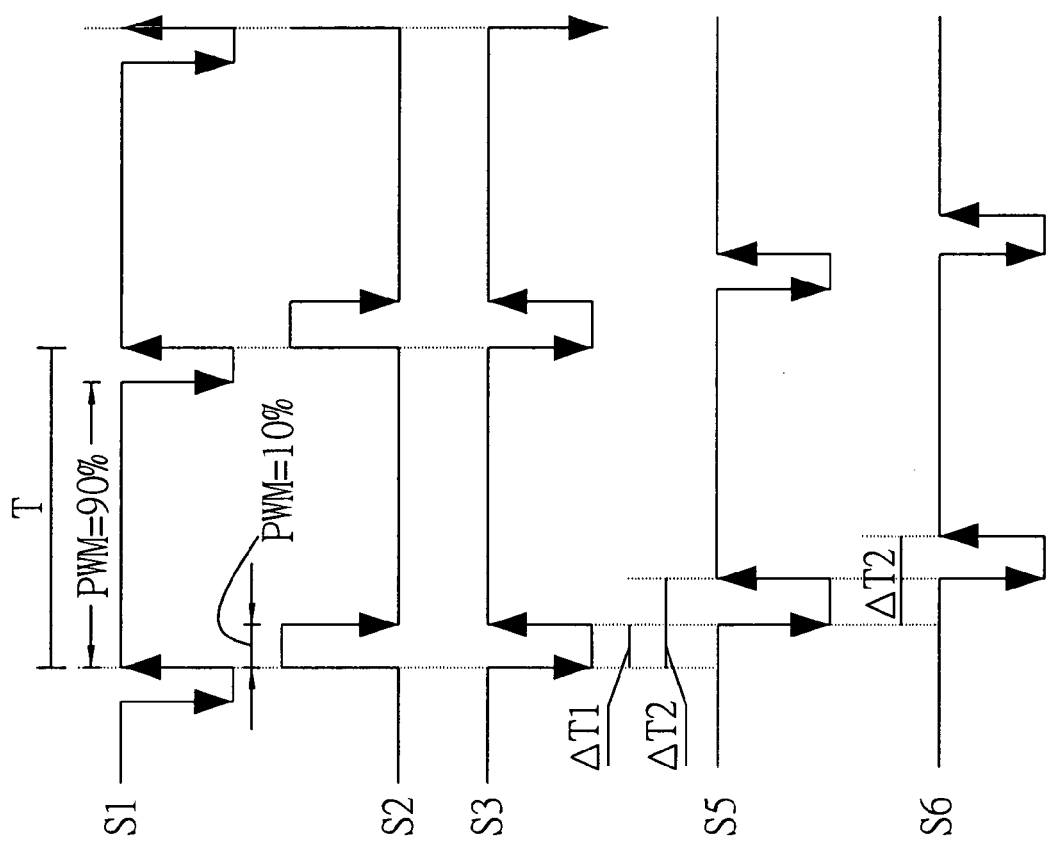
FIGS. 5 and 6 depict waveform schematic diagrams of three PWM signal generated by the fan controlling system according to the present invention.
Figure 6:
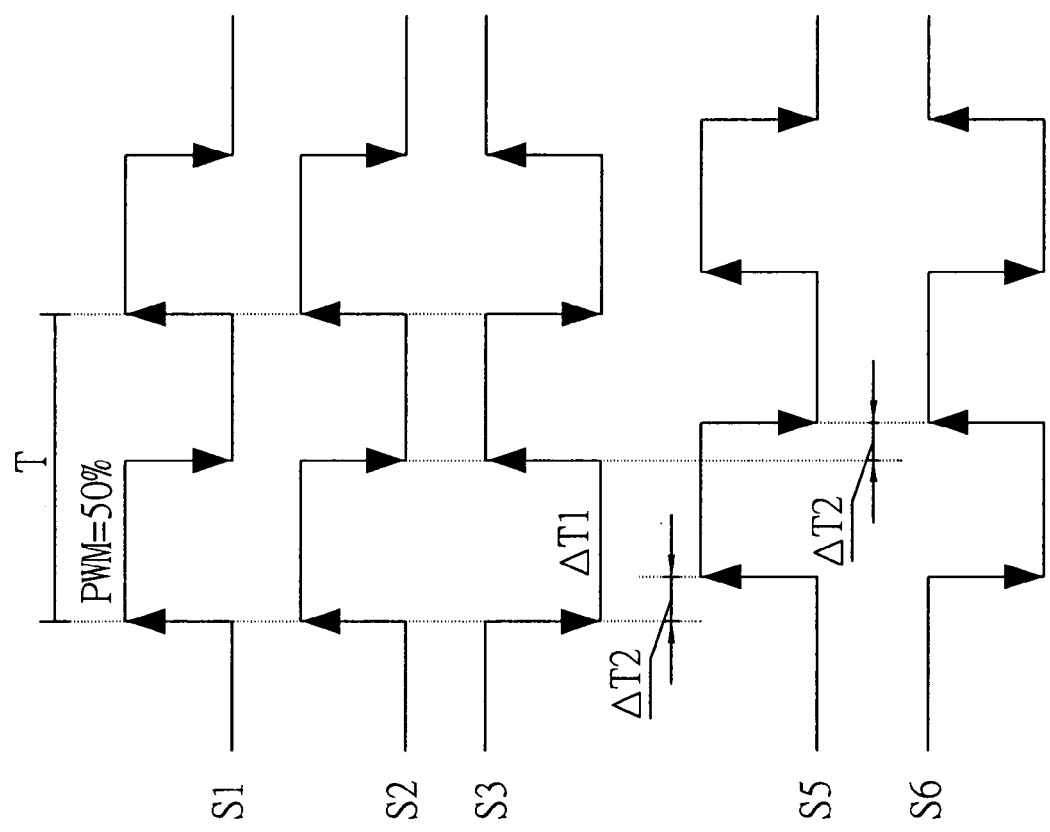

The phase-inverting module 42 is used to receive and invert the second PWM signal S2 into a phase-inverted signal, and output the phase-inverted signal to the fan 52, which is also included in the first group, so as to control the fan 52 with the phase-inverted signal. More particularly, the phase-inverting module 42 is a phase inverter, which is used to invert a phase of the second pulse width modulation signal S2 output from the second signal generating module 41 and generate the phase-inverted signal, the phase-inverted signal then being output to the fan 52 to control a rotating speed of the fan 52. As shown in FIG. 5, when the duty cycle A of the first PWM signal S1 is equal to 90%, the duty cycle B of the second PWM signal S2 is 10%, which can be derived from equation (1), and a duty cycle C of a third PWM signal S3, which is generated from the phase-inverting module 42 by inverting the first PWM signal S1, is also equal to 90%. However, the third PWM signal S3 lags behind the first PWM signal S1 by a first time interval ΔT1 (which is equal to one tenth of a time cycle T). When a voltage level of the first PWM signal S1 is changed, for example from low voltage level "0" to high voltage level "1", the PWM signal S3 is turned from high voltage level "1" to low voltage level "0". With reference to FIG. 6, if the duty cycle A of the first PWM signal S1 is 50%, the duty cycle B of the second PWM signal S2 is also 50%, which can be derived from equation (1), and the duty cycle C of the PWM signal S3 is also 50% after being inverted by the phase-inverting module 42 from the second PWM signal S2. However, the PWM signal S3 lags behind the first PWM signal S1 by a second time interval ΔT2 (which is equal to a half of the time cycle T). As described above, when the duty cycle A of the first PWM signal S1 varies within a range between 0 and 100%, the duty cycle B of the second PWM signal S2 varies within another range between 100% and 0, which can be derived from equation (1), and the PWM signal S3 is generated from the phase-inverting module 42 by inverting the first PWM signal S1 and has the duty cycle C equal to the duty cycle A of the first PWM signal S1. Therefore, the fans 51, 52, both of which are included in the first group, are controlled to rotate at two different rotating speeds according to the first PWM signal S1 and the PWM signal S3 respectively, which lags behind the first PWM signal S1 by the first time interval ΔT1.

The delay module 43 is used to delay the first PWM signal S1 outputted from the first signal generating module 40 by a predetermined time interval ΔT2 (for example one tenth of the time cycle T), and then outputs a first delay signal to the fan 53, which is included in the second group, so as to control the fan 53 with the first delay signal. The delay module 43 is further used to delay a phase-inverted signal S5 output from the phase-inverting module 42 by the second time interval ΔT2, and then output a second delay signal to the fan 54, so as to control the fan 54 with the second delay signal. More particularly, the delay module 43 is one selected from a group consisting of a delayer with a delaying function and a delay circuit, both of which are used to delay the first PWM signal S1 and the phase-inverted signal, that is the third PWM signal S3, by the second time interval ΔT2, and then generate the PWM power (voltage or current)

signals S5 and S6, so as to control rotating speeds of the fans 53, 54, both of which are included in the second group, with the PWM signals S5 and S6.

In addition, in other exemplary embodiment according to the present invention, more than four, for example six or eight, fans can be installed in the electronic system 5, and these fans are categorized into a plurality of groups, each of the group includes two fans. Fans of one of the groups are controlled by the PWM signals respectively generated by the first signal generating module 40 and the second generating module 41 according to the present invention. The delay module 43 should be added to the electronic system 5 to delay the PWM signals generated by the first signal generating module 40 and the second generating module 42 by a variety of time intervals, so as to control fans of the other groups.

Figure 7:
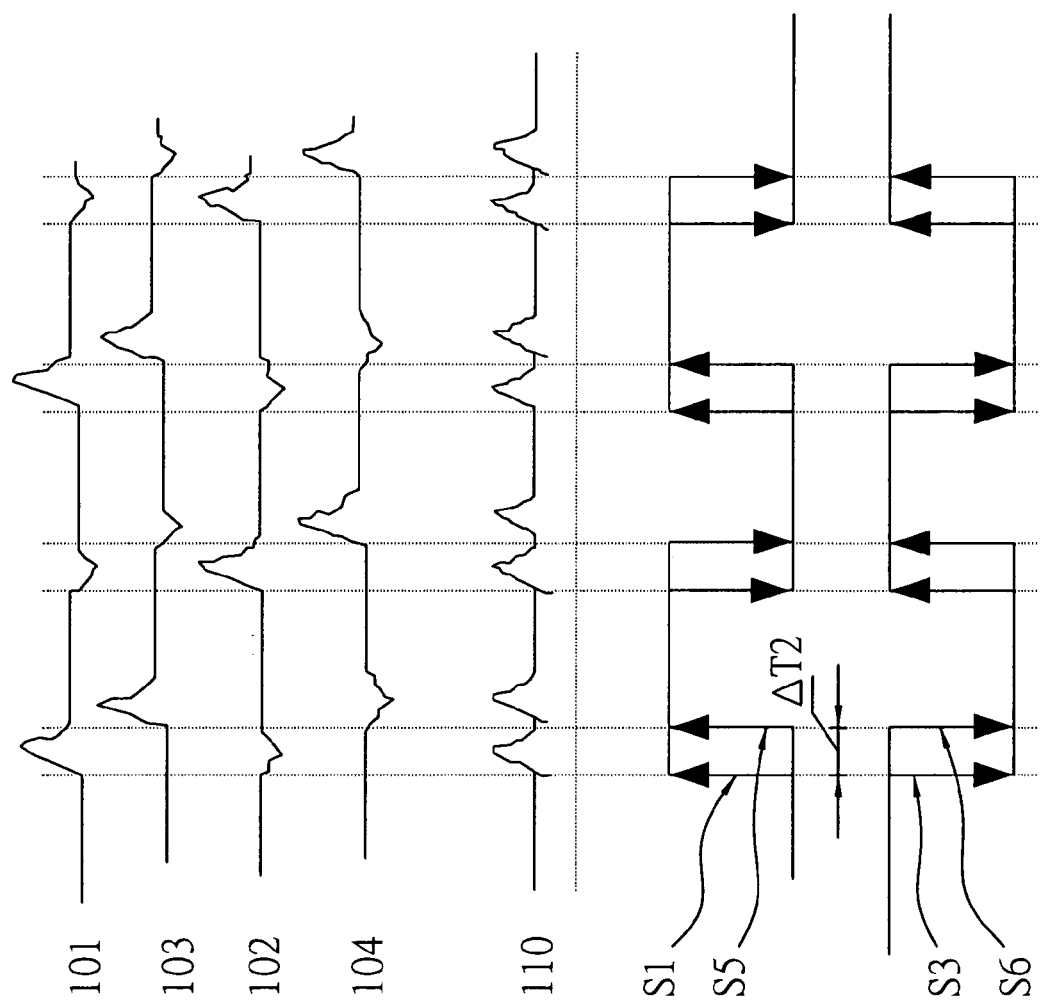
FIG. 7 depicts waveform schematic diagram of four PWM signal generated by the fan controlling system according to the present invention, the power signal of the fans and the total power signal.

In order to highlight advantage and feature of the present invention, detailed description is described below. As shown in FIG. 7, the first PWM signal S1 generated by the signal generating module 40, the PWM signal S5 generated from the delay module 43 by delaying the first PWM signal S1 by the second time interval ΔT2, the PWM signal S3 that is inverted the phase of the second PWM signal S2 generated by the signal generating module 41 by the phase-inverting module 42, and the PWM signal S6 after delaying the PWM signal S3 with the second time interval ΔT2 by the delay module 43 respectively control the fans of the two groups such as the fans 51, 52, 53 and 54, then the power (voltage or current) signal 101, 102, 103 and 104 respectively corresponding to the fans 51, 52, 53 and 54 are obtained as shown in FIG. 7. As described above, there is a certain time delay among the PWM signals S1, S3, S5, S6, peak values of power signals generated on the fans 51, 52, 53 and 54 are staggered with each other, so the amplitude value of the total power signal 110 imposed on the fans can not increase instantly, thereby avoiding power for supplying the electronic system 5 from decreasing instantly, which makes the electronic system run abnormally and unsteadily.

As described above, the fan controlling system according to the present invention, the first PWM signal and the second PWM signal, duty sum of which is 1, are provided by the first signal generating module and the second signal generating module, so that operations of each fan contained in the first group of fans are directly controlled by the first PWM signal and the second PWM signal that is phase-inverting, simultaneously operations of each fan contained in the second group of fans are controlled by the first PWM signal and the phase-inverting second PWM signal that are delayed with a time interval by the delay module. Therefore, the fan controlling system according to the present invention can control the PWM signals of multiple fans assembled in the electronic system to generate delay with a time interval one another, avoiding the peak value of the total power signals when PWM signals of the fans are run from low voltage level to high voltage level from increasing instantly, and power for supplying the electronic system from decreasing instantly, making the electronic system run abnormally, and its stability becomes worse.

In addition, in the present invention, when the fans of the electronic system is added, it is necessary to add delay module with different delay factors to the fan controlling system which can delay the first PWM signal and the phase-inverting second PWM signal for outputting, so as to control operation of the subsequent added fans, thereby significantly upgrading the design spring of the circuit.

The above-described exemplary embodiments are to describe various objects and features of the present invention as illustrative and not restrictive. A person of ordinary skill in the art would recognize that changes and modification could be made in form and detail without departing from the sprit and the scope of the invention. Thus, the right protective scope of the present invention should fall within the appended claim.

What is claimed is:

1. A fan controlling system applicable in an electronic system having a plurality of fans, the fan controlling system comprising:
   a signal generating module comprising a first signal generating module and a second signal generating module, both of which are used for generating pulse width modulation (PWM) signals and outputting the PWM signals to the fans of the electronic system according to control instructions output by the electronic system, so as to control the fans with the pulse width modulation signals;
   a phase-inverting module for inverting a second pulse width modulation signal outputted from the second signal generating module into a phase-inverted signal, which has a phase inverted to that of the second width modulation signal, and providing the phase-inverted signal to a second fan of the electronic system, so as to control the second fan with the phase-inverted signal; and
   at least a delay module for delaying a first pulse width modulation signal outputted from the first signal generating module and the phase-inverted signal generated by the phase-inverting module to generate a first delay signal and a second delay signal respectively, and outputting the first delay signal and the second delay signal respectively to a third fan and a fourth fan of the electronic system, so as to control the third fan and the fourth fan with the first delay signal and the second delay signal respectively.

2. The fan controlling system of claim 1, wherein the first pulse width modulation signal has a first duty cycle, and the second pulse width modulation signal has a second duty cycle equal to one subtracted by the first duty cycle.

3. The fan controlling system of claim 1, wherein the phase-inverting module is one selected from a group consisting of a phase inverter and a phase-inverting circuit.

4. The fan controlling system of claim 1, wherein the delay module is one selected from a group consisting of a delay circuit and a delayer.

5. The fan controlling system of claim 1, wherein the first signal generating module and the second signal generating module are pulse width modulation generators.

6. The fan controlling system of claim 1, wherein the electronic system is one selected from a group consisting of a computer system and a server system.

* * * * *